(12) United States Patent
Raorane et al.

(10) Patent No.: US 10,804,117 B2
(45) Date of Patent: Oct. 13, 2020

(54) METHOD TO ENABLE INTERPOSER TO INTERPOSER CONNECTION

(71) Applicant: Intel Corporation, Santa Clara, CA (US)

(72) Inventors: Digvijay Ashokkumar Raorane, Chandler, AZ (US); Ravindranath V. Mahajan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 128 days.

(21) Appl. No.: 15/937,453

(22) Filed: Mar. 27, 2018

(65) Prior Publication Data

US 2019/0304809 A1 Oct. 3, 2019

(51) Int. Cl.

| H01L 21/56  | (2006.01) |
| H01L 21/683 | (2006.01) |
| H01L 21/68  | (2006.01) |
| H01L 21/66  | (2006.01) |
| H01L 23/00  | (2006.01) |
| H01L 23/538 | (2006.01) |
| H01L 25/065 | (2006.01) |

(52) U.S. Cl.
CPC .......... H01L 21/565 (2013.01); H01L 21/561 (2013.01); H01L 21/68 (2013.01); H01L 21/683 (2013.01); H01L 22/20 (2013.01); H01L 23/5381 (2013.01); H01L 24/13 (2013.01); H01L 24/16 (2013.01); H01L 24/32 (2013.01); H01L 24/83 (2013.01); H01L 25/0652 (2013.01); H01L 25/0655 (2013.01);

*H01L 2224/13111* (2013.01); *H01L 2224/13147* (2013.01); *H01L 2224/13155* (2013.01); *H01L 2224/16148* (2013.01); *H01L 2224/32137* (2013.01); *H01L 2224/83005* (2013.01); *H01L 2224/83121* (2013.01)

(58) Field of Classification Search
CPC ..... H01L 21/68; H01L 21/683; H01L 21/565; H01L 22/20; H01L 2224/83121; H01L 2224/16148; H01L 24/13; H01L 24/16
See application file for complete search history.

(56) References Cited

U.S. PATENT DOCUMENTS

| 8,276,262 B2 * | 10/2012 | Wienrich ............... H01L 21/683 118/500 |
| 2013/0049188 A1 * | 2/2013 | Choi ................... H01L 23/3135 257/717 |

* cited by examiner

*Primary Examiner* — Marcos D. Pizarro
*Assistant Examiner* — Antonio B Crite
(74) *Attorney, Agent, or Firm* — Schwegman Lundberg & Woessner, P.A.

(57) ABSTRACT

A method of aligning semiconductor dies having metallic bumps in a mold chase for further processing. A plurality of semiconductor dies are placed in the mold chase at approximately desired locations for further processing. A plurality of magnets in a retainer are associated with the mold chase, the plurality of magnets being associated with respective ones of the plurality of semiconductor dies. The magnetic field of the magnets is applied to align and hold the plurality of dies at the desired location. The plurality of magnets may be adjustably mounted in the retainer so that they can be adjusted to more precisely align the semiconductor dies at the desired locations.

23 Claims, 8 Drawing Sheets

FIG. 1A  PATTERNING & PLATING Ni

METHOD TO ENABLE INTERPOSER TO INTERPOSER CONNECTION

TECHNICAL FIELD

Embodiments described herein generally relate to placing small dies on larger interposers with tight pitch and with very high accuracy relative to each other in order to achieve economical yield with tighter pitch.

BACKGROUND

Scaling of the die-package first level interconnect (FLI) pitch is a key parameter limiting Moore's Law scaling of bump limited circuits. FLI means die to die interconnect or die to package interconnect. As silicon (Si) transistors get smaller in size, FLI pitch should scale down to fully leverage the benefit of scaling, to keep die size smaller and hence lower the cost. Due to the nature of scaling, it becomes increasingly difficult to achieve good yield in early implementations of new Si nodes. One critical need is the ability to place top dies onto bottom interposer dies with very high accuracy relative to each other in order to achieve economical yield with tighter pitch. The tighter the pitch, the higher is the demand for such accuracy. Previous solutions to satisfy this need were not satisfactory for meeting the demands of the consumer electronics market for increasingly complex functions requiring very intricate circuitry. Therefore there is a need for ways to significantly scale the pitch down, e.g., in the sub-10 μm regime, and to accurately place dies with very high accuracy.

DESCRIPTION OF EMBODIMENTS

The present subject matter improves die stacking (e.g., stacking an upper die on a lower die in an electronic package). Stacking an upper die on lower die can increase the level of integration and communication among dies as well as decrease the overall length and width of the electronic package. By providing communicative coupling directly between one or more lower dies and an upper die, an electrical path length of a circuit between the dies can be decreased. For instance, in some embodiments the electrical connection between the dies can be more direct and can avoid the substrate. Reducing the electrical path length can increase transmission speed and decrease signal power loss.

In scaling of a die, defects of the same size and distribution have a greater influence and affect more circuits on next node of Si than on previous nodes of Si. The smaller the die size, the higher are the chances of avoiding disastrous defects. The reason for this is that the total number of defects is reduced with lower die sizes. As a result, it becomes very important to reduce die size as much as possible to minimize the impact of yield and cost. This in turn can call for stitching of smaller dies to achieve performance equivalent of a bigger die. As used in this context, "stitching" means connecting smaller die physically and electrically on a package. One architecture for die-stitching of multiple dies is an architecture where small dies in the latest nodes are placed on larger interposers consisting of active dies from previous generation silicon. As used in this context, "latest nodes" means leading edge silicon on advanced nodes on Moore's Law and "previous generation silicon means devices built on prior generations of Moore's Law. One critical need in scaling the die package in semiconductor manufacture is the ability to place top dies on to bottom interposer dies with very high accuracy relative to each other in order to achieve economical yield with tighter pitch. The tighter the pitch, the higher is the demand for such accuracy. In case of the above architecture, the bottom/interposer die is also limited in size due to yield concerns and reticle limitations. However products often need larger interposer die size, sometimes higher than the reticle limit. In these cases yield or reticle limit considerations require stitching two bottom interposer dies together using a silicon bridge. Currently, fan-out wafer level packaging using wafer equipment is a cost effective solution to allow stitching. In some embodiments mold is used for added strength. Pitch reduction capabilities rely on characterizing and compensating for mold shrinkage. Successful wafer level processes depend on mold properties such as shrinkage, the coefficient of thermal expansion (CTE) of mold, the glass transition temperature (Tg), and other relevant parameters and properties. Such properties depend on degree of cure of mold. It is estimated that current fan-out wafer level packages will be limited to FLI pitches of ~50 μm due to alignment limitations imposed by mold shrinkage. Previous architectures used as a solution to these limitations stitched an interposer die across a reticle on the wafer, or used an Embedded Multi-die Interconnect Bridge (EMIB) architecture to connect two interposer dies using a Si bridge in the substrate. Previous solutions for aligning the die on the interposer during manufacture were to compensate for mold shrinkage or to increase the misalignment margin by reducing the critical dimension (CD) significantly. The foregoing solutions were not satisfactory for meeting the demands of the consumer electronics market for increasingly complex functions requiring very intricate circuitry.

The process, product and architecture disclosed herein has several advantages over the above previous solutions. A major advantage of the disclosed subject matter is that it allows for topside bridge attach and allows significant bridge and non-bridge FLI pitch scaling, down e.g., in the sub-10

μm regime as opposed to the ~50 μm limitation discussed above. This greatly reduces, or eliminates a major disadvantage of today's architectures where the link requires signal transmission through through-silicon vias (TSVs), which entails both reduced power efficiency and increased signal losses.

The disclosed embodiments also allow interposer die size reduction, and hence results in improved yield and reduced costs.

The disclosed embodiments depend on magnetic force for placement. Therefore they allow increased process flexibility. By varying the magnetic strength of magnet/residual magnetism, dimensions of the magnets, the number of ferromagnetic bumps, and the bump dimensions, the disclosed subject matter will accommodate different die sizes and allow the use of different mold materials. Thus, the disclosed solution reduces dependence on mold properties and increases the mold material window.

Existing mold-based solutions rely on mold properties to account for shrinkage of mold and hence corresponding displacement and rotation of dies. Mold properties depend on degree of cure. Such degree of cure can vary from location to location within a mold chase. Hence, it is difficult to compensate for local variation in displacement caused by mold, limiting the accuracy of die placement. The disclosed subject matter has few or no such limitations and, as discussed above, allows for a wider choice of mold materials which can help in controlling warpage of the final package. The disclosed subject matter also does not rely on organic material which are notorious for lack of repeatability of properties due to variation in cure percentage, residual stress, and variation in CTE due to local temperature variations, or dimensions. It provides more margin for a mold curing process in as much as placement accuracy and curing of the mold are decoupled in the proposed scheme as opposed to current solutions.

Accuracy of die placement is controlled by the ability to create a master template with magnets. Accuracy of such metallic structures can be very high, based on matured manufacturing processes such as those used in creating a mold chase or a mold die/cast. Accuracy of alignment is much higher than that typically seen in embedded panel level ball grid arrays (ePLB) (about +/−10 um) as measured in internal design of experiments (DOEs).

Current solutions are more suitable for smaller dies (8×8 mm), as smaller dies would lead to smaller rotations which are easier to compensate for the disclosed solution is essentially independent of die size, as it depends on placement accuracy of Ni bumps on backside of wafers which is more or less modular in nature.

The disclosed scheme is based on existing materials and processes and does not change significantly or measurably if mold material is changed. It requires less time to fine-tune the proposed scheme as it does not need detailed characterization of mold material and curing process to understand compensation of die displacement. In case of a solution that utilizes TCB for die placement, uniformity of die thickness of top dies affect the outcome. The proposed scheme is independent of that issue.

Some embodiments allow rotation of dies while a bridge is being connected to them.

Thermo-compression bonding (TCB) necessitates use of epoxy flux to protect bonded joints during subsequent assembly. No such limitation exists for the disclosed scheme.

The disclosed embodiments are compatible with current architectures, unlike one based on TCB which has the unique risk when filling a cavity with under-fill after bridge attachment. A TCB process can also lead to voids in middle of the die complex (which voids are TCB enabled) due to presence of bridges with epoxy flux in them.

Stitching of bottom interposer dies using a Si bridge inside a substrate (e.g., EMIB) is more challenging as it is more difficult to scale the package using organic materials. The disclosed solution is easier to scale since scaling occurs inside the Si and does not need any organic material to scale.

Figure 1A:
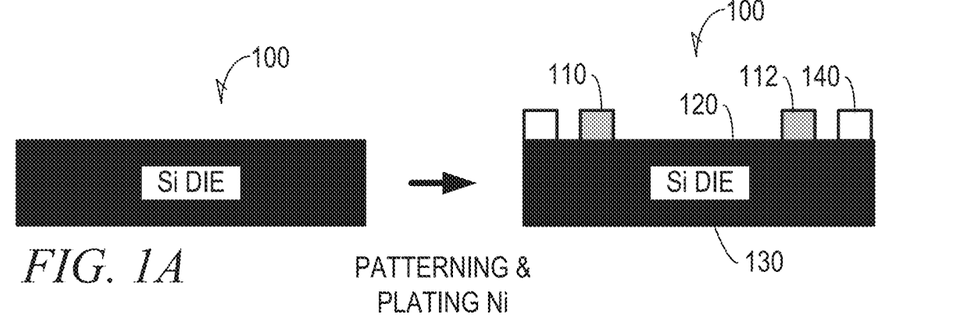
FIG. 1A illustrates process flow for a die with nickel bumps, in side view, in various stages of the process, according to some embodiments.
Figure 1B:
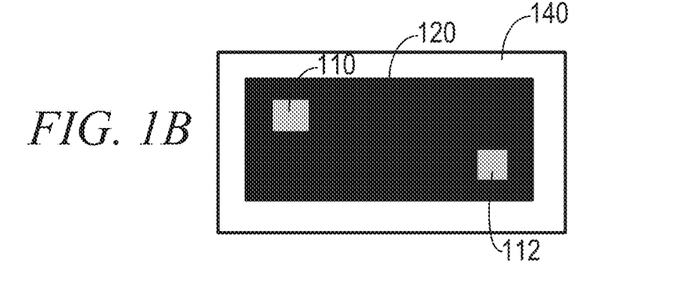
FIGS. 1B-1C illustrate process flow for the die of FIG. 1A, in top view, according to some embodiments.
Figure 1C:
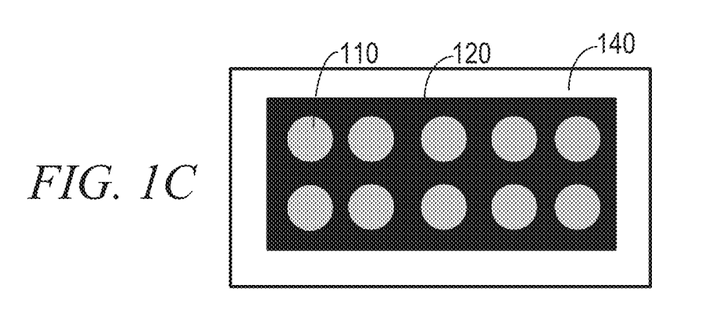
Figure 2A:
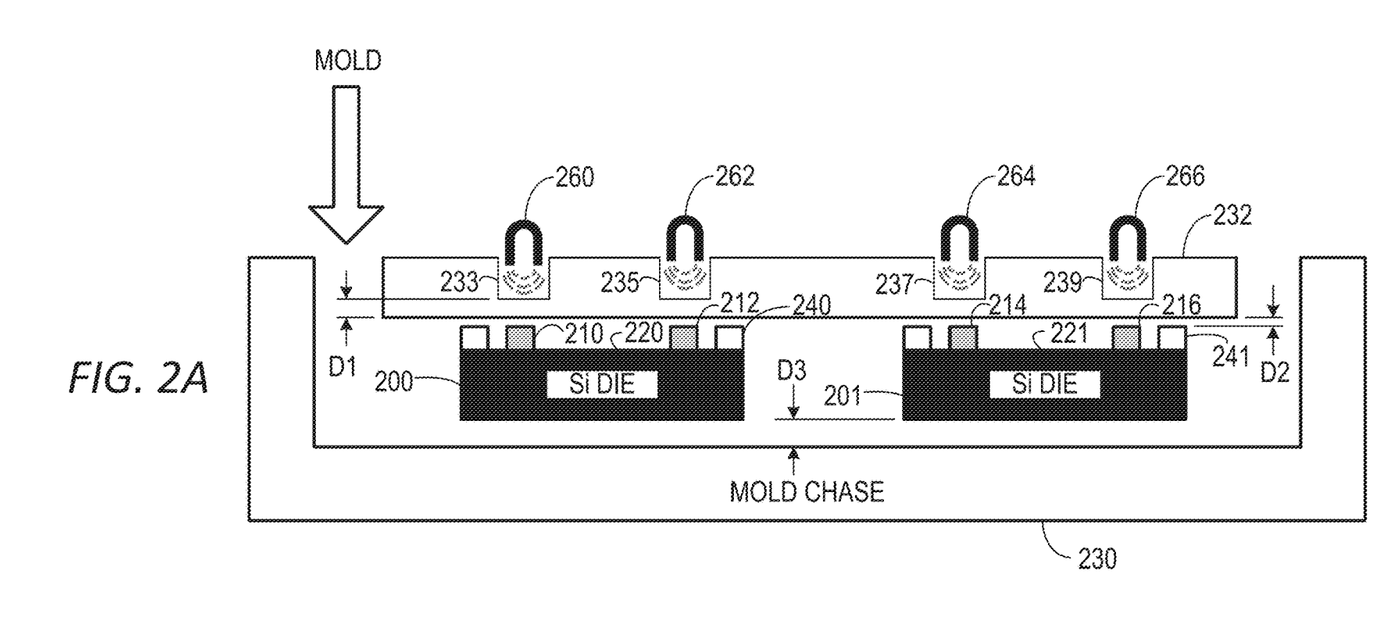
FIGS. 2A-2B illustrate process flow showing the molding of bottom/interposer silicon dies which are held in place by magnetic force using nickel bumps on the back side of the bottom interposer dies, in side view, according to some embodiments.
Figure 2B:
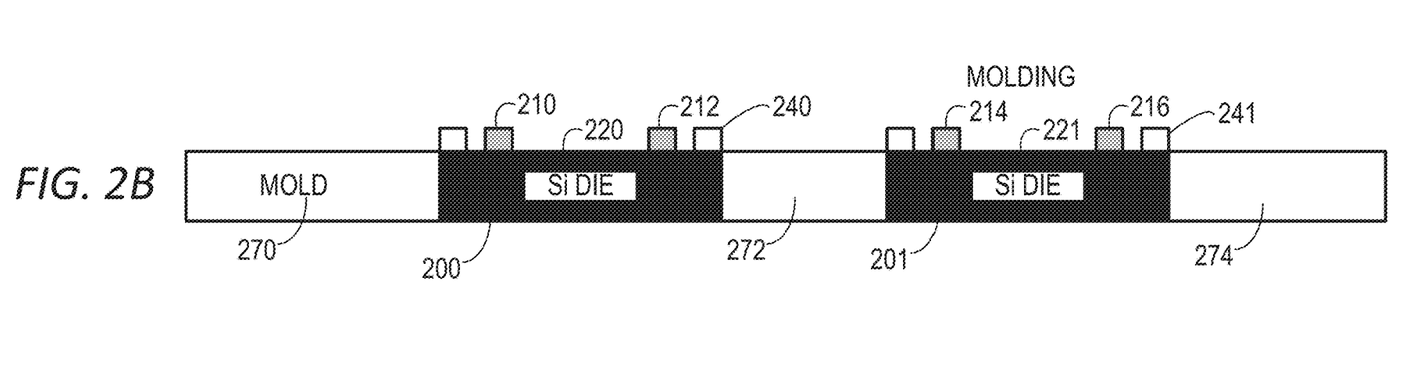

FIG. 1A illustrates process flow for a die with nickel (Ni) bumps, in side view, in various stages of the process, according to some embodiments. FIG. 1A shows an embodiment with ferro-magnetic bumps 110 on the back side 120 of a bottom/interposer die 100. In this case, once front side 130 of Si is fabricated completely, the backside 120 of the die undergoes patterning. In this context, front side means the side of the die on which components such as transistors are located. Back side generally means metal layers (on the other side of the silicon). Bumps can be achieved using carrier wafers for TSV bump plating. Two lithography steps can be used to pattern the Ni bumps 110, 112 and a Cu fence 140. The Cu fence 140 along the perimeter of the backside 120 of Si die 100 helps to prevent mold from getting on top of the bumps 110, 112. The number of Ni bumps can be varied depending on the need. The shape (square/round, and other appropriate shapes) can also be varied. FIGS. 1B-1C illustrate process flow for the die of FIG. 1A, in top view, according to some embodiments. FIG. 1B illustrates a top view of the backside 120 of Si die 100. In FIG. 1B there are, illustratively, two Ni bumps 110, 112. FIG. 1C illustrates a top view of backside 120 with ten Ni bumps 120, one of which is enumerated 110. In each of FIGS. 1B and 1C the copper fence 140 is seen around the perimeter of backside 120. FIGS. 2A-2B illustrate process flow showing the molding of bottom/interposer silicon dies 200, 201 which are held in place by magnetic force using nickel bumps on the back side 220, 221 of the respective bottom/interposer silicon, and magnets 260-266, in side view, according to some embodiments. FIG. 2A shows a mold process. Bottom/interposer dies 200, 201 are then placed inside the mold chase 230, or similar container, using magnetic field based alignment. For example, a magnetic field is present inside the chase due to a plurality of magnets 260-266 held in position by a retainer 232. The magnets may be electromagnets or permanent magnets, depending, in some embodiments, on the strength of the magnetic field desired to hold the die(s). In some embodiments, retainer 232 may be a top of a mold chase 230 or similar container, although the retainer need not be on the top of the mold chase. In some embodiments the cut-out areas, or cavities, 233, 235, 237, 239 of retainer 232 are such that the magnets 260-266 each have space for adjustment as discussed in the sequence of steps below. The depth to which the magnets extend into the cut outs is a matter of design. Dimension D1 may be designed such that the cavity rib is not too weak and therefore likely to buckle. However it should not be so thick that it impedes the magnetic field. In other words, the retainer thickness should be set so as to not buckle under stress or to shield the magnetic field significantly. While the retainer can act as a shield, thus reducing the magnetic force experienced by the bumps on the die, too thick a retainer would reduce the magnetic force to an unacceptably low level that does not result in the intended alignment and securing. On the other hand, too thin a retainer would buckle under pressure inside the mold chase. In some embodiments the dimension D1 would be close to greater than one half the total thickness of the retainer 232. The dimension D2, when the dies are coupled to the top of the retainer, would be essentially zero. Retainer 232 is illustrated as having openings at two sides of FIG. 2A. In some embodiments, the design of the mold chase 230 can be such that retainer 232 forms a part of the mold chase, for example to retain mold when the mold is introduced into the chase, discussed below.

In some embodiments, dimension D3 may be essentially zero, with the dies placed on the floor of the mold chase. In some embodiments, dimension D3 may be sufficient to allow an adhesive such as molar to be used to hold the dies on the floor of the chase, but that is not a requirement. Whether an adhesive is used or not, by placing the dies on the chase floor and then using the magnetic field to align the dies, it is possible to remove the magnet field and check the location of the dies, with subsequent adjustment of the position of the magnets as may be needed to further align and hold the dies.

In some embodiments the dies 200, 201 are placed approximately at the desired location for the dies in the chase, using fiducials to place the dies close to the final (desired) position. Each magnet 260-266 may then attract a corresponding Ni bump 210, 212, 214, 216 in some embodiments. The dies 200, 201 may aligned using alignment features in the dies and the base of the mold chase. As discussed above, soft adhesive may be used to hold the dies in place. The magnetic field is then switched on to complete the fine alignment. The dies are then secured at the desired location by the magnetic force of the magnets. In some embodiments the retainer could be at the bottom of the chase. The dies could then be placed physically on the retainer with the magnetic force not applied. The chase cavity may then be placed around the retainer and the application of the magnetic force is applied in the discussed sequence of steps. In one embodiment, the sequence of steps to secure the dies at the desired location comprise:

a. place the dies in the chase at the approximate desired location for additional steps such as adding mold;
  b. turn on the electromagnets to obtain magnetic force;
  c. secure the dies in the desired position via electromagnetism;
  d. turn off the electromagnets;
  e. check the positional accuracy of the dies using a top side die map;
  f. recalibrate or adjust the magnet positions as needed and turn the electromagnets on and off for positional accuracy of the dies;
  g. apply mold material.

The above sequence is for an electromagnet where the magnetic field can be turned on and off. Another embodiment comprises using permanent magnets. In this embodiment the permanent magnets can be inserted into and removed from the retainer cavities when the magnetic force is to be applied and not applied (for example, as in step d. for electromagnets) to align and hold the dies. In some embodiments the permanent magnets can be placed in fixed templates so their positions are set for a given die package Once the dies are secured in place via magnetic force, the appropriate mold is introduced in the chase and cured to lock the dies in place permanently. FIG. 2B illustrates the bottom/interposer dies 200, 201 after the chase has been removed. Mold is illustrated at 270-274. The copper fence 240, 241 is seen in both FIG. 2A and FIG. 2B.

Figure 2C:
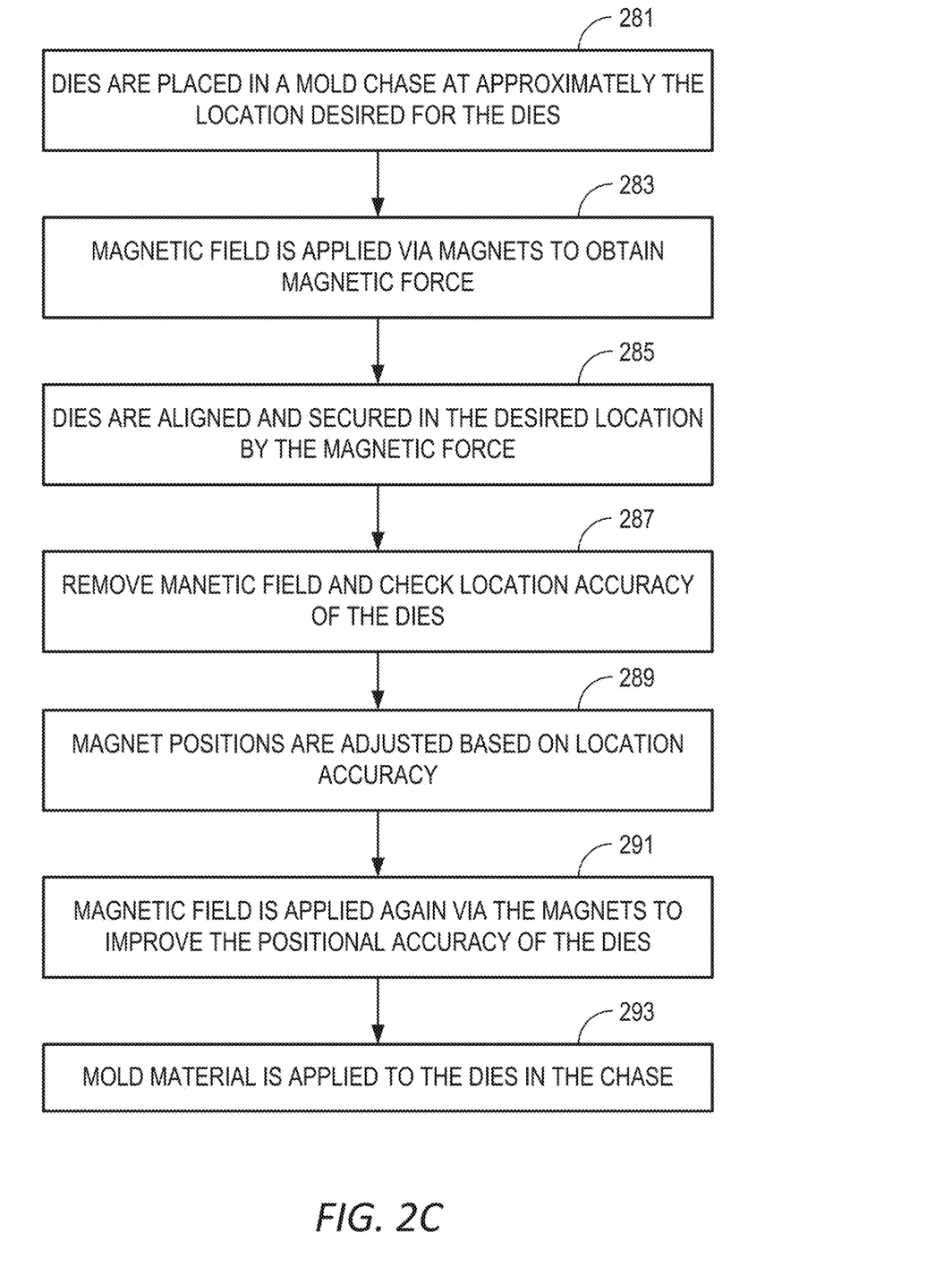
FIG. 2C is a flowchart illustrating the process of FIGS. 2A-2B, according to some embodiments.

FIG. 2C is a flowchart illustrating the process of FIGS. 2A-2B, according to some embodiments. At 281, the dies are placed in chase 230 at approximately the desired location for subsequent processing. At 283, a magnetic field is applied via magnets that are adjustably positioned in a retainer, to obtain a magnetic force. The magnets may be electromagnets that are switchable on and off. Alternatively the magnets may be permanent magnets that are configured to apply and remove a magnetic field from the dies. At 285 the dies are aligned and secured in the desired location by the magnetic force. At 287 the magnetic field may be removed and the location at which the magnetic force aligned and held the dies is checked for accuracy. For example, the location of the dies versus the desired location of the dies may be checked. At 289 the magnet positions are adjusted, based on location accuracy, to improve the location of the dies, and at 291 the magnetic field is applied again to improve the positional accuracy of the dies. If the location accuracy is already sufficient for the need of the particular process, step 289 may not be undertaken. On the other hand, steps 287, 289 and 291 may be undertaken more than once as needed by the accuracy of the location of the dies. When the dies are aligned and secured at the desired locations, additional process steps, such as applying mold to the dies in the mold chase are undertaken, as at 293.

A generalized mold chase may operate according to the following principles, according to various embodiments. The mold chase may receive and load one or more dies, which in some instances may be part of a substrate package. A first portion of the chase and a second portion of the chase may be provided in order to be brought together to a closed soft-clamp position to form a chamber, and vacuum pumping may begin as may be appropriate for the process used. A die compression mechanism may be used, for example to be driven down to press against the dies. When all dies and associated interconnects are secured, mold transfer may begin. Molten mold material may flow through a mold control, such as a mold gate, at a speed which in some embodiments may be a controlled speed. The clamping between the first portion and the second portion may increase to contain the mold material in the cavity of the chase until a final hard clamp is achieved. In some embodiments, once the transfer of the mold material is complete a cure may be performed within the mold chase to solidify the mold material. The first portion and the second portion may be separated and the die package may be ejected. A post mold cure may be performed in a cure oven to complete during of the mold material. Thereafter, additional process steps, like those below, may be undertaken.

Figure 3A:
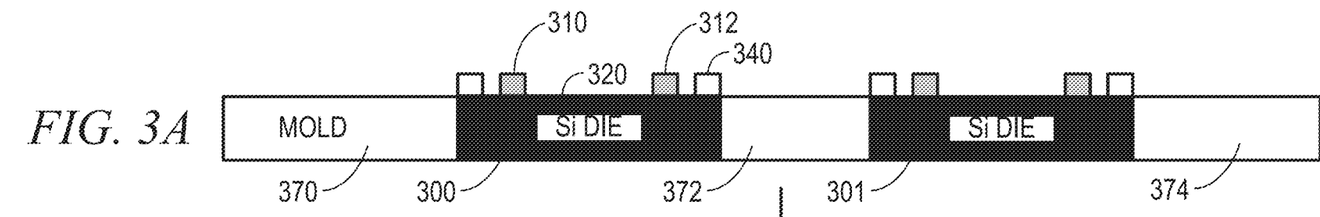
FIGS. 3A-3D illustrate process flow showing removal of nickel bumps from the backside of an interposer, in side view, according to some embodiments.
Figure 3B:
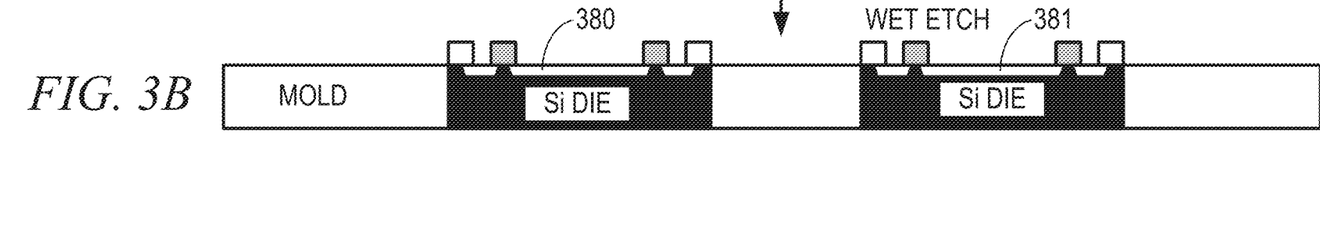
Figure 3C:
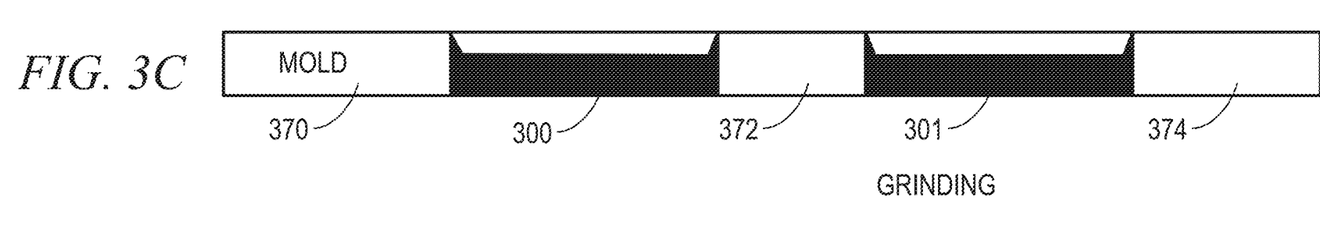
Figure 3D:
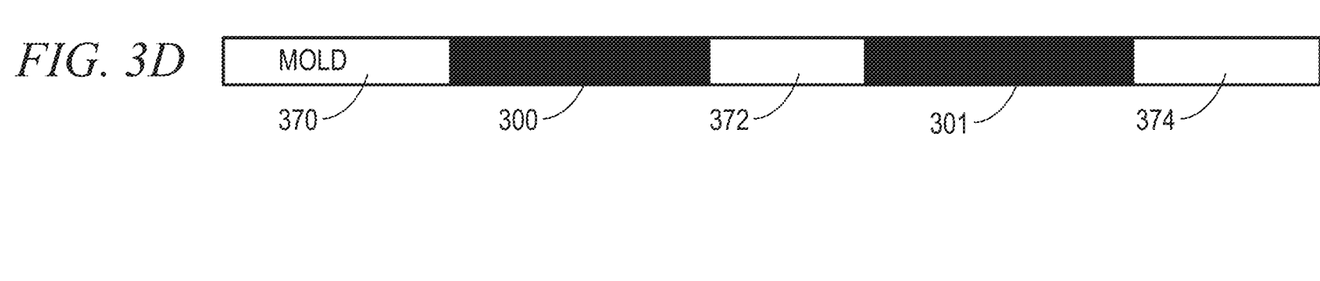

FIGS. 3A-3D illustrate process flow showing removal of nickel bumps from the backside, according to some embodiments. FIG. 3A shows a method of removing Ni bumps if they are not needed in the final assembly. In this embodiment, wet etching is conducted on backside 320 of the die 300. The described method for die 300 would also be performed on die 301. The wet etch can use, in some embodiments, potassium hydroxide (KOH) or tetramethylammonium hydroxide (TMAH), and cause undercut of the Si below the Ni bumps 310, 210, as illustrated at 380, 381 of FIG. 3B. When the etch process continues for a sufficient time, the bumps 310, 312 fall off and are removed from the die as illustrated by the absence of bumps in FIG. 3C. At this stage, the mold 370-374 is at a higher level than Si as illustrated in FIG. 3C. The mold is then ground off to bring the mold 370-374 flush with the Si 300, 301 as illustrated in FIG. 3D.

Figure 4A:
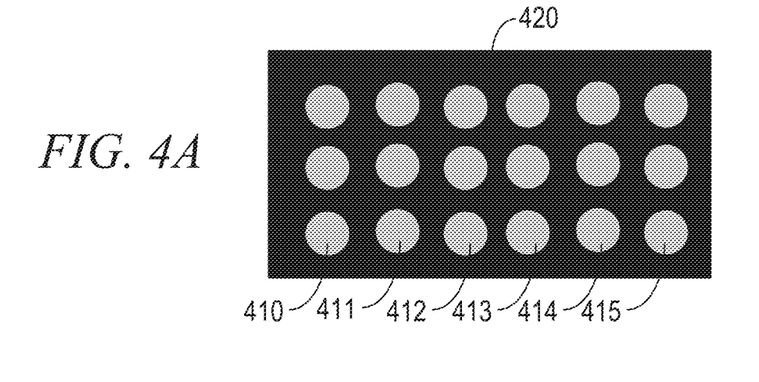
FIG. 4A illustrates a top view of an architecture with nickel bumps on the backside without a copper fence, according to some embodiments.
Figure 4B:
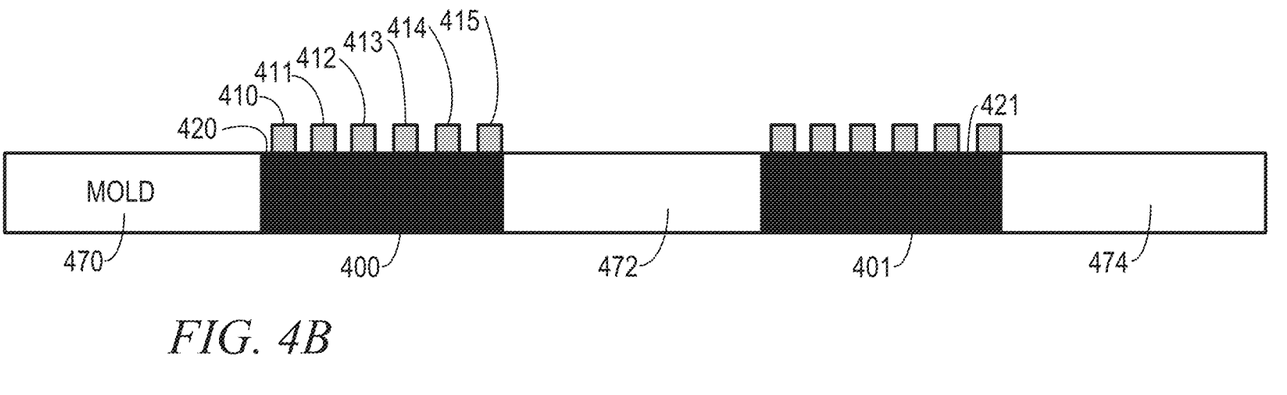
FIG. 4B illustrates a side view of the die complex assembly corresponding to that of FIG. 4A, with mold, according to some embodiments.

FIG. 4A illustrates a top view of an architecture with nickel bumps, one row of which is enumerated 410-415, on the backside 420 of the illustrated die, without a copper fence, according to some embodiments. FIG. 4B illustrates a side view of a die complex assembly corresponding to that of FIG. 4A, with mold, according to some embodiments.

The illustrated die of FIG. 4A is a top view of either of die 400 or 401 of FIG. 4B. FIG. 4A illustrates a 6×3 array of Ni bumps. FIGS. 4A-4B illustrate two molded interposer dies embodiment where no Cu fence is present around the top side 420, 421 of bottom/interposer dies 400, 401. The illustrated architecture of FIG. 4B, as in FIGS. 3A-3B, includes mold, 470-474. In such cases, it is critical to prevent contamination of Ni bumps due to mold on the tops of the bumps. This may be achieved by backside tape which protects those bumps. In other words, and adhesive or appropriate sticky tape can be applied to the top of the bumps, such as the top to which reference numerals 410-415 of FIG. 4B are tagged in the illustration. This process has been developed for quad flat packages (QFP), according to some embodiments. In such process flow, tape may be placed on the top surface of the bumps that are on the backside 420, 421 before mold is introduced in the cavity (the cavity is not shown, but is the same or similar to the mold chase of FIG. 2A) and is removed after the mold is cured, resulting in the complex shown in FIG. 4B.

Figures 5A, 5B, 5C, 5D:
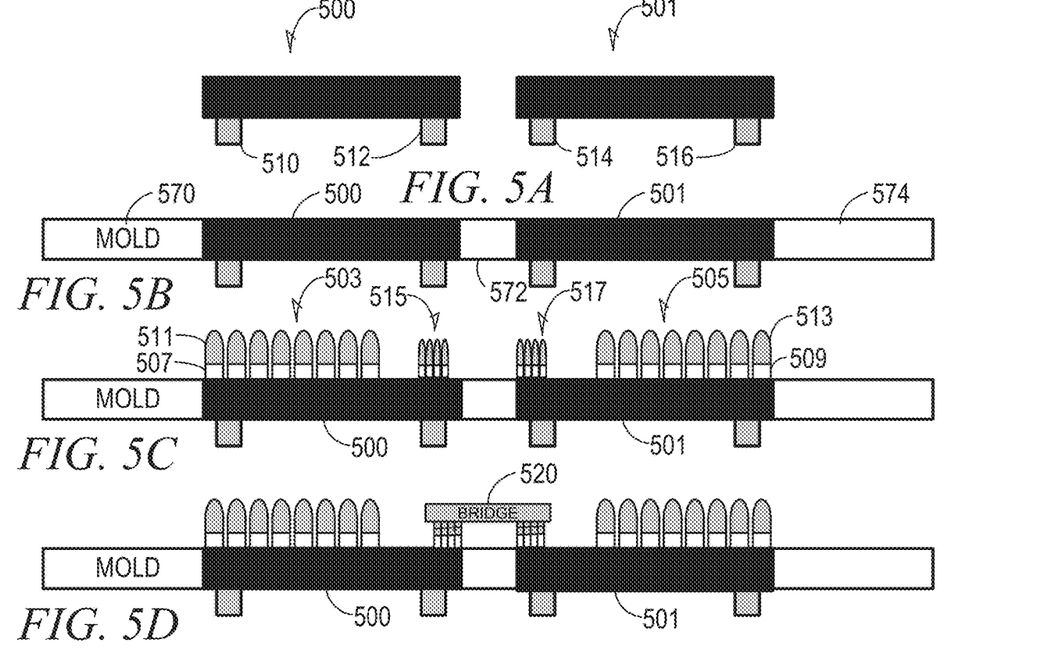
FIGS. 5A-5G illustrate process flow for a top side bridge attach on interposer dies, in side view, according to some embodiments.
Figures 5E, 5F:
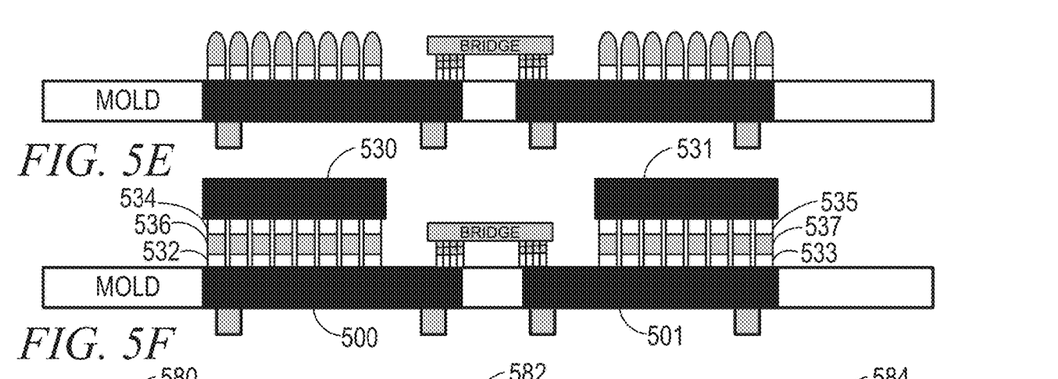
Figure 5G:
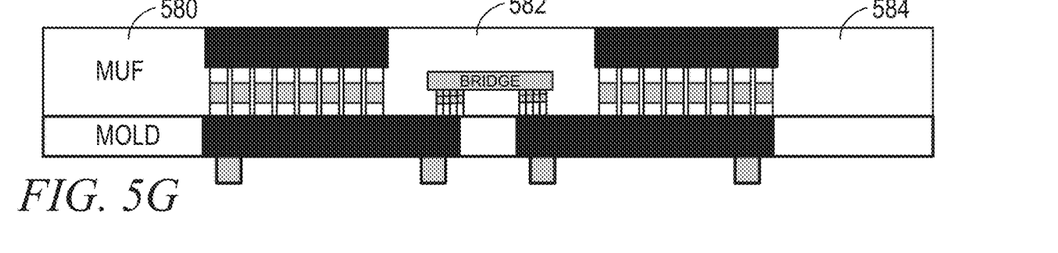

FIGS. 5A-5G illustrate process flow for top side bridge attach on interposer dies, in side view, according to some embodiments. FIG. 5A illustrates Si die process flow and final assembly that incorporates such a die complex. The result is similar to FIG. 1A (dies 500, 501 with two bumps 510-512, 514, 516, respectively, without the copper fence illustrated). FIG. 5B illustrates the assembly of FIG. 5A with bumps 503, 505 added to the topside of dies 500, 501. Each bump comprises copper pillars 507, 509. The dome-like sections 511, 513 comprise solder which in some embodiments is tin based. As shown in FIG. 5D, Si bridge 520 connects bottom/interposer dies 500, 501 together via bumps 515, 517 seen in FIG. 5C, allowing smaller and faster communication among them. Bumps 515, 517 each comprise a plurality of bumps similar to bumps 503, 505, except they are smaller. In some embodiments, bottom/interposer dies 500, 501 are first molded together using the nickel based alignment described with respect to FIGS. 2A-2B, although metal other than nickel may be used. Dies 500, 501 are then plated to have copper-tin (Cu—Sn) bumps such as 507, 511 described above. A silicon bridge may then be attached using a TCB process, for example. Top dies 530, 531 may then be attached as in FIG. 5E, using a TCB process. In some embodiments copper pillars 532, 533 are part of bottom interposer dies 500, 501, respectively, of FIG. 5E, the copper pillars 534, 535 are part of top dies 530, 531, respectively, and the solder 536, 537 may be part of both top and bottom dies, respectively. The entire joint, which may be a system-in-a board (SIB) joint, may then be molded using mold under fill (MUF).

Figure 6:
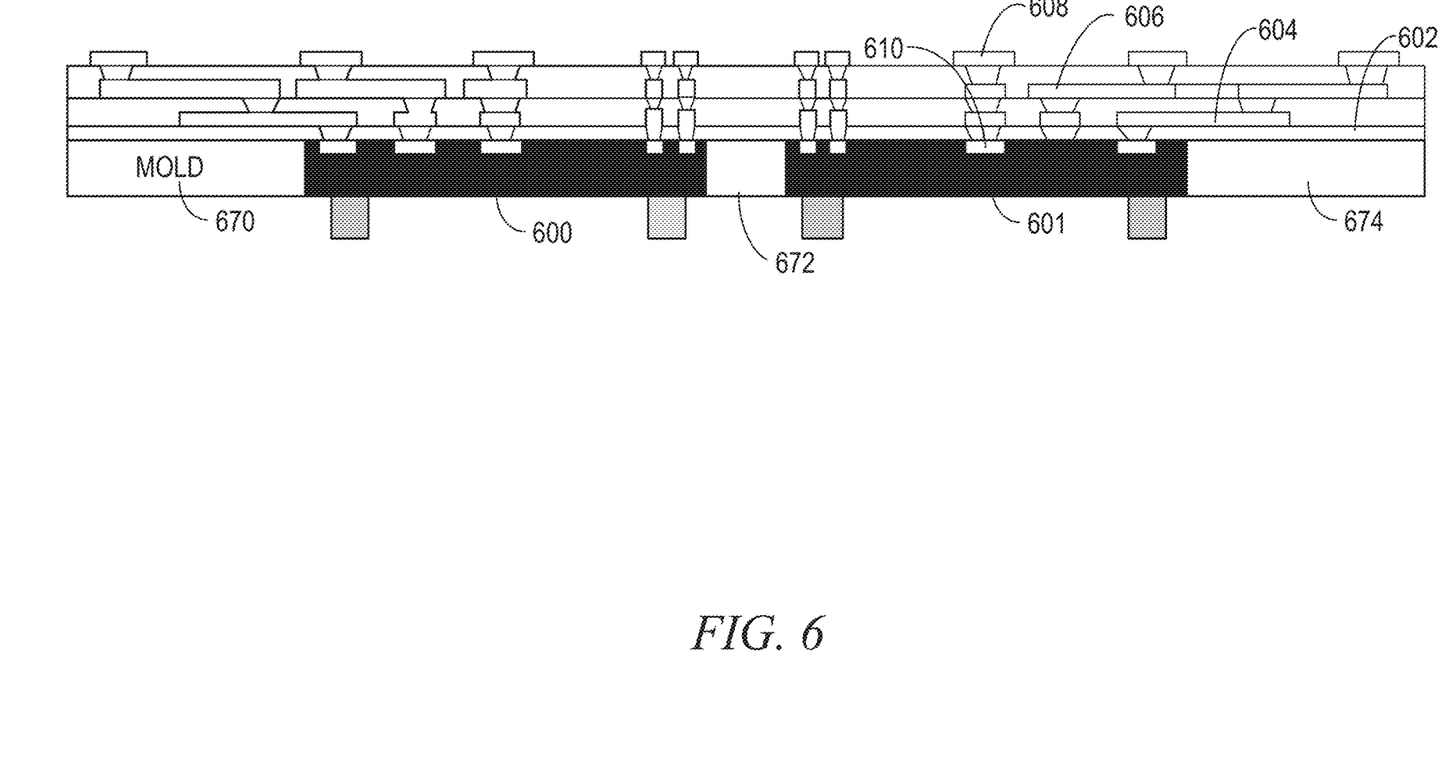
FIG. 6 illustrates incorporation of build-up layers on top of the bottom interposer die, in side view, according to some embodiments.

FIG. 6 illustrates incorporation of build-up layers on top of the bottom interposer dies 600, 601, in side view, according to some embodiments. The current scheme can be employed to fan out/in using horizontal build layers on bottom/interposer dies such as shown at 602, 604 in FIG. 6. This process can be with or without a semiconductor bridge. In the embodiment being described, a first build layer 602 may be spun/pressed on top of bottom reconstructed die-mold complex 670, 600, 672, 601, 674. It may then be cured. A via such as 608 may then be drilled in the layer such that the via lands on the pad 610 below thus establishing an electrical connection to the bottom die 601. In some embodiments pad 610 is an intrinsic part of bottom die 601. It can be an embedded pad or a bump. It can be formed on the bottom die using typical semiconductor plating processes.

The drill generates heat which may cause melting and smearing of the polymer used, with consequent lack of adhesion of the copper plate and a failure of electrical connection. Therefore the via may then be desmeared using an alkali process comprising use of potassium permanganate in some embodiments, and the via may then be plated using an electro-less Cu process. It is then patterned and electroplated to fill the via and define the traces of the die. A buildup layer may be pressed on top of it and the process is repeated all over again in order to add multiple build up layers needed to fan-in or fan-out electrical connections.

In one embodiment, pressure applied during the mold process is approximately ~3 Mega pascal (MPa). Such pressure is produced by the mold that is forced into the mold chase. The pressure is faced by the die inside the mold and very high or maximum force would be experienced by the full thickness and the full reticle die. The force may be approximately 58 Newtons (N).

Magnets that may be used in a master template incorporated in mold chase for this application, as in FIG. 2A may have N52 grade with a residual magnetism Br=1.4. Magnets with other parameters may also be used, as appropriate. The magnetic dimensions to provide the above force can be a radius=1 mm and a height=10 cm for an embodiment with 150 bumps. Ni bumps on the backside of the die may be of same radius and in same numbers as that of the magnets used.

Figure 7:
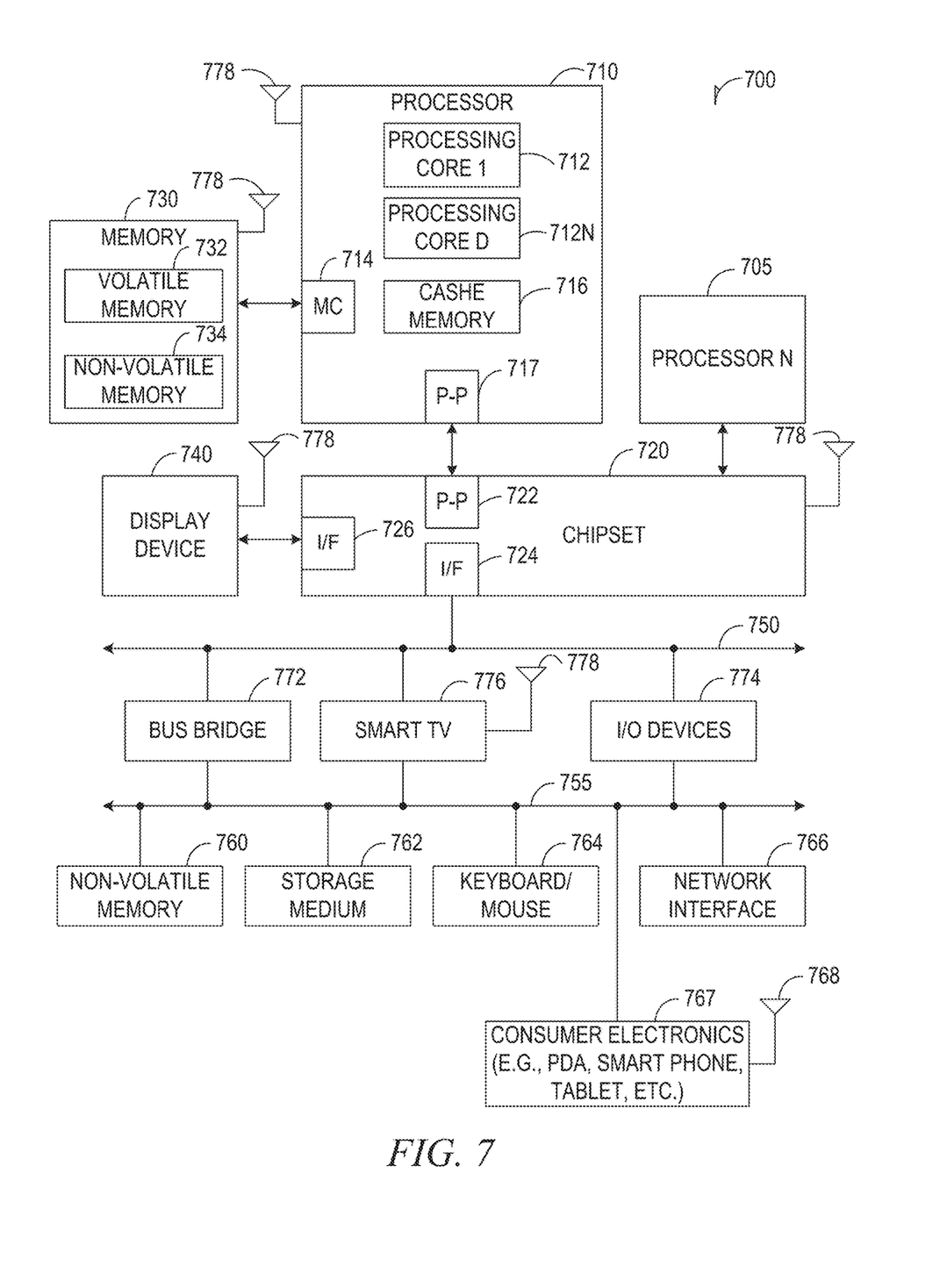
FIG. 7 illustrates a system level diagram, depicting an example of an electronic system which can include one or more integrated circuits manufactured using the methods described herein, in accordance with some embodiments.

FIG. 7 illustrates a system level diagram, depicting an example of an electronic system which can include one or more integrated circuits manufactured using the methods described herein, in accordance with some embodiments. FIG. 7 is included to show an example of a higher level device application for integrated circuits manufactured employing the methods described herein to enable interposer to interposer connection. In one embodiment, system 700 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 700 is a system on a chip (SOC) system.

In one embodiment, processor 710 has one or more processor cores 712 and 712N, where 712N represents the Nth processor core inside processor 710 where N is a positive integer. In one embodiment, system 700 includes multiple processors including 710 and 705, where processor 705 has logic similar or identical to the logic of processor 710. In some embodiments, processing core 712 includes, but is not limited to, pre-fetch logic to fetch instructions, decode logic to decode the instructions, execution logic to execute instructions and the like. In some embodiments, processor 710 has a cache memory 716 to cache instructions and/or data for system 700. Cache memory 716 may be organized into a hierarchal structure including one or more levels of cache memory.

In some embodiments, processor 710 includes a memory controller 714, which is operable to perform functions that enable the processor 710 to access and communicate with memory 730 that includes a volatile memory 732 and/or a non-volatile memory 734. In some embodiments, processor 710 is coupled with memory 730 and chipset 720. Processor 710 may also be coupled to a wireless antenna 778 to communicate with any device configured to transmit and/or receive wireless signals. In one embodiment, an interface for wireless antenna 778 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 732 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 734 includes, but is not limited to, flash memory, phase change memory (PCM), read-only memory (ROM), electrically erasable programmable read-only memory (EEPROM), or any other type of non-volatile memory device.

Memory 730 stores information and instructions to be executed by processor 710. In one embodiment, memory 730 may also store temporary variables or other intermediate information while processor 710 is executing instructions. In the illustrated embodiment, chipset 720 connects with processor 710 via Point-to-Point (PtP or P-P) interfaces 717 and 722. Chipset 720 enables processor 710 to connect to other elements in system 700. In some embodiments of the example system, interfaces 717 and 722 operate in accordance with a PtP communication protocol such as the Intel® QuickPath Interconnect (QPI) or the like. In other embodiments, a different interconnect may be used.

In some embodiments, chipset 720 is operable to communicate with processor 710, 705N, display device 740, and other devices, including a bus bridge 772, a smart TV 776, I/O devices 774, nonvolatile memory 760, a storage medium (such as one or more mass storage devices 762), a keyboard/mouse 764, a network interface 766, and various forms of consumer electronics 777 (such as a PDA, smart phone, tablet etc.), and similar devices. In one embodiment, chipset 720 couples with these devices through an interface 724. Chipset 720 may also be coupled to a wireless antenna 778 to communicate with any device configured to transmit and/or receive wireless signals.

Chipset 720 connects to display device 740 via interface 726. Display 740 may be, for example, a liquid crystal display (LCD), a plasma display, cathode ray tube (CRT) display, or any other form of visual display device. In some embodiments of the example system, processor 710 and chipset 720 are merged into a single SOC. In addition, chipset 720 connects to one or more buses 750 and 755 that interconnect various system elements, such as I/O devices 774, nonvolatile memory 760, storage medium 762, a keyboard/mouse 764, and network interface 766. Buses 750 and 755 may be interconnected together via a bus bridge 772.

In one embodiment, mass storage device 762 includes, but is not limited to, a solid state drive, a hard disk drive, a universal serial bus flash memory drive, or any other form of computer data storage medium. In one embodiment, network interface 766 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 7 are depicted as separate blocks within the system 700, the functions performed by some of these blocks may be integrated within a single semiconductor circuit or may be implemented using two or more separate integrated circuits. For example, although cache memory 716 is depicted as a separate block within processor 710, cache memory 716 (or selected aspects of 716) can be incorporated into processor core 712.

EXAMPLES

Example 1 is an apparatus for alignment of an object having ferromagnetic components, comprising: a container configured to align the object at approximately a desired location within the container; and at least one electromagnet configured in a retainer, the at least one electromagnet aligned with at least one of the ferromagnetic components, wherein when the magnetic field of the at least one electromagnet is electronically activated, the magnetic field operates to align and hold the object at the desired location within the container for further processing.

In Example 2, the subject matter of Example 1 optionally includes wherein the retainer is adjacent the container.

In Example 3, the subject matter of any one or more of Examples 1-2 optionally include wherein the retainer is part of the container.

In Example 4, the subject matter of any one or more of Examples 1-3 optionally include wherein the object is a semiconductor die, the ferromagnetic components are metallic bumps, and the container is a mold chase configured to apply mold material to the semiconductor die.

In Example 5, the subject matter of Example 4 optionally includes wherein the at least one electromagnet comprises a plurality of electromagnets and the plurality of electromagnets aligns with respective ones of the metallic bumps.

In Example 6, the subject matter of any one or more of Examples 4-5 optionally include wherein the mold chase is configured to receive the mold material for configuring the semiconductor die into a package.

In Example 7, the subject matter of Example 6 optionally includes wherein the mold material is injected into the mold chase under pressure.

In Example 8, the subject matter of any one or more of Examples 4-7 optionally include wherein one surface of the semiconductor die comprises a fence configured to protect the metallic bumps from contamination by the mold material.

In Example 9, the subject matter of any one or more of Examples 4-8 optionally include wherein tape is applied to the metallic bumps to protect the metallic bumps from contamination by the mold material.

Example 10 is a method of aligning and holding in position an object having ferromagnetic components, comprising: providing a container configured to align the object at approximately a desired location within the container; and disposing at least one electromagnet in a retainer, the at least one electromagnet aligned with at least one of the ferromagnetic components, wherein when the magnetic field of the at least one electromagnet is electronically activated, the magnetic field operates to align and hold the object at the desired location within the container.

In Example 11, the subject matter of Example 10 optionally includes wherein the object is a semiconductor die, the ferromagnetic components are metallic bumps, and the container is a mold chase is configured for application of mold material to the semiconductor die.

In Example 12, the subject matter of Example 11 optionally includes wherein one surface of the mold chase is configured perpendicular to the force of gravity that operates on the container.

In Example 13, the subject matter of any one or more of Examples 11-12 optionally include wherein the at least one electromagnet comprises a plurality of electromagnets and the plurality of electromagnets align with respective ones of the metallic bumps.

In Example 14, the subject matter of any one or more of Examples 11-13 optionally include wherein the mold chase is configured to receive the mold material for configuring the semiconductor die into a package.

In Example 15, the subject matter of Example 14 optionally includes wherein the mold material is injected into the container under pressure.

In Example 16, the subject matter of any one or more of Examples 11-15 optionally include wherein one surface of the semiconductor die comprises a fence configured to protect the metallic bumps from contamination by the mold material.

In Example 17, the subject matter of any one or more of Examples 11-16 optionally include wherein tape is applied to the metallic bumps to protect the metallic bumps from contamination by the mold material.

In Example 18, the subject matter of any one or more of Examples 11-17 optionally include wherein the retainer is adjacent the mold chase or is part of the mold chase.

Example 19 is a method of aligning and holding in a desired position semiconductor dies having metallic bumps, comprising: placing a plurality of semiconductor dies in a mold chase approximately at desired locations for further processing; providing a plurality of magnets in a retainer associated with the mold chase, the plurality of magnets associated with respective ones of the plurality of dies; applying a magnetic field of the magnets to align and hold the plurality of dies in the desired locations.

In Example 20, the subject matter of Example 19 optionally includes wherein the magnets are adjustably positioned in the retainer.

In Example 21, the subject matter of Example 20 optionally includes removing the magnetic field and checking the locations of the dies against the desired locations of the dies.

In Example 22, the subject matter of Example 21 optionally includes adjusting the position of the magnets in the retainer based on the locations of the dies, and applying the magnetic field of the magnets to align and hold the plurality of dies in the desired locations.

In Example 23, the subject matter of any one or more of Examples 20-22 optionally include wherein the retainer is adjacent the mold chase or is part of the mold chase.

In Example 24, the subject matter of any one or more of Examples 19-23 optionally include wherein the plurality of magnets are electromagnets that are configured to be electrometrically activated to apply the magnetic field.

In Example 25, the subject matter of any one or more of Examples 19-24 optionally include wherein the plurality of magnets are permanent magnets that are configured to intermittently apply the magnetic field to respective ones of the plurality of semiconductor dies.

In Example 26, the subject matter of any one or more of Examples 19-25 optionally include wherein the mold chase is configured to receive mold material for configuring the semiconductor die into a package.

In Example 27, the subject matter of Example 26 optionally includes wherein the mold material is injected into the mold chase under pressure.

In Example 28, the subject matter of any one or more of Examples 19-27 optionally include wherein the retainer is at the top of the mold chase or at the bottom of the mold chase.

In Example 29, the subject matter can include, or can optionally be combined with any portion or combination of, any portions of any one or more of Examples 1 through 27 to include, subject matter that can include means for performing any one or more of the functions of Examples 1 through 27, or a machine-readable medium including instructions that, when performed by a machine, cause the machine to perform any one or more of the functions of Examples 1 through 27.

What is claimed is:

1. An apparatus for alignment of a semiconductor die having ferromagnetic metallic bumps, comprising:
    a mold chase configured to align the object at approximately a desired location within the container and configured to apply mold material to the semiconductor die;
    at least one electromagnet configured in a retainer, the at least one electromagnet aligned with at least one of the ferromagnetic metallic bumps, wherein when the magnetic field of the at least one electromagnet is electronically activated, the magnetic field operates to align and hold the semiconductor die at the desired location within the mold chase for further processing; and
    wherein one surface of the semiconductor die comprises a fence configured to protect the metallic bumps from contamination by the mold material.

2. The apparatus of claim 1 wherein the retainer is adjacent the mold chase.

3. The apparatus of claim 1 wherein the retainer is part of the mold chase.

4. The apparatus of claim 1 wherein the at least one electromagnet comprises a plurality of electromagnets and the plurality of electromagnets aligns with respective ones of the metallic bumps.

5. The apparatus of claim 1 wherein tape is applied to the metallic bumps to protect the metallic bumps from contamination by the mold material.

6. The apparatus of claim 1 wherein the mold chase is configured to receive the mold material for configuring the semiconductor die into a package.

7. The apparatus of claim 6 wherein the mold material is injected into the mold chase under pressure.

8. A method of aligning and holding in a desired position semiconductor dies having metallic bumps, comprising:
    placing a plurality of semiconductor dies in a mold chase approximately at desired locations for further processing, wherein each of the semiconductor die include:
        one or more ferromagnetic metallic bumps; and
        a fence configured to protect the ferromagnetic metal bumps from contamination by a mold material;
    providing a plurality of magnets in a retainer associated with the mold chase, the plurality of magnets associated with respective ones of the plurality of dies;
    applying a magnetic field of the magnets to align and hold the plurality of dies in the desired locations.

9. The method of claim 8 wherein the plurality of magnets are electromagnets that are configured to be electrometrically activated to apply the magnetic field.

10. The method of claim 8 wherein the plurality of magnets are permanent magnets that are configured to intermittently apply the magnetic field to respective ones of the plurality of semiconductor dies.

11. The method of claim 8 wherein the retainer is at the top of the mold chase or at the bottom of the mold chase.

12. The method of claim 8 wherein the mold chase is configured to receive mold material for configuring the semiconductor die into a package.

13. The method of claim 12 wherein the mold material is injected into the mold chase under pressure.

14. The method of claim 8 wherein the magnets are adjustably positioned in the retainer.

15. The method of claim 14 wherein the retainer is adjacent the mold chase or is part of the mold chase.

16. The method of claim 14 further comprising removing the magnetic field and checking the locations of the dies against the desired locations of the dies.

17. The method of claim 16 comprising adjusting the position of the magnets in the retainer based on the locations of the dies, and applying the magnetic field of the magnets to align and hold the plurality of dies in the desired locations.

18. An apparatus for alignment of a semiconductor die having ferromagnetic metallic bumps, comprising:
 a mold chase configured to align the object at approximately a desired location within the container and configured to apply mold material to the semiconductor die;
 at least one electromagnet configured in a retainer, the at least one electromagnet aligned with at least one of the ferromagnetic metallic bumps, wherein when the magnetic field of the at least one electromagnet is electronically activated, the magnetic field operates to align and hold the semiconductor die at the desired location within the mold chase for further processing; and
 tape applied to the metallic bumps and configured to protect the metallic bumps from contamination by the mold material.

19. The apparatus of claim 18 wherein the retainer is adjacent the mold chase.

20. The apparatus of claim 18 wherein the retainer is part of the mold chase.

21. The apparatus of claim 18 wherein the at least one electromagnet comprises a plurality of electromagnets and the plurality of electromagnets aligns with respective ones of the metallic bumps.

22. The apparatus of claim 18 wherein the mold chase is configured to receive the mold material for configuring the semiconductor die into a package.

23. The apparatus of claim 18 wherein one surface of the semiconductor die comprises a fence configured to protect the metallic bumps from contamination by the mold material.

* * * * *